United States Patent [19]

Norman et al.

[11] Patent Number: 5,583,350
[45] Date of Patent: Dec. 10, 1996

[54] FULL COLOR LIGHT EMITTING DIODE DISPLAY ASSEMBLY

[75] Inventors: Michael P. Norman, Chandler; Paige M. Holm, Phoenix, both of Ariz.

[73] Assignee: Motorola, Schaumburg, Ill.

[21] Appl. No.: 552,155

[22] Filed: Nov. 2, 1995

[51] Int. Cl.$^6$ ................................ H01L 33/00
[52] U.S. Cl. .................. 257/88; 257/89; 257/91; 257/99; 257/40
[58] Field of Search .................. 257/13, 88, 89, 257/90, 91, 92, 103, 40; 362/800; 313/500, 510; 361/805, 806

[56] References Cited

U.S. PATENT DOCUMENTS 5,432,358  7/1995  Nelson et al. ......................... 257/81
5,459,337  10/1995  Ito et al. ............................... 257/89

FOREIGN PATENT DOCUMENTS 59-58877  4/1984  Japan ................................ 257/89
3-261182  11/1991  Japan ................................ 257/89
3-290983  12/1991  Japan ................................ 257/99

*Primary Examiner*—Minhloan Tran
*Attorney, Agent, or Firm*—Robert F. Hightower

[57] ABSTRACT

A full color light emitting diode display (310) utilizes semiconductor light emitting diodes (313) to produce red light and either organic or semiconductor light emitting diodes (312) to produce blue light. Green light is produced by either semiconductor light emitting diodes (313) or by organic light emitting diodes (343). An array of semiconductor light emitting diodes is formed on a semiconductor substrate (322) and an array of organic or semiconductor light emitting diodes is formed on an optically transparent substrate (311). The optically transparent and semiconductor substrates are attached together to form the multi-wavelength light emitting diode display (310).

18 Claims, 5 Drawing Sheets

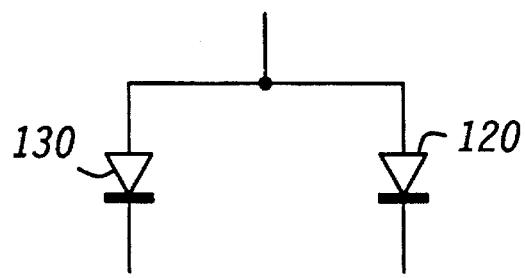
FIG. 7  _110_
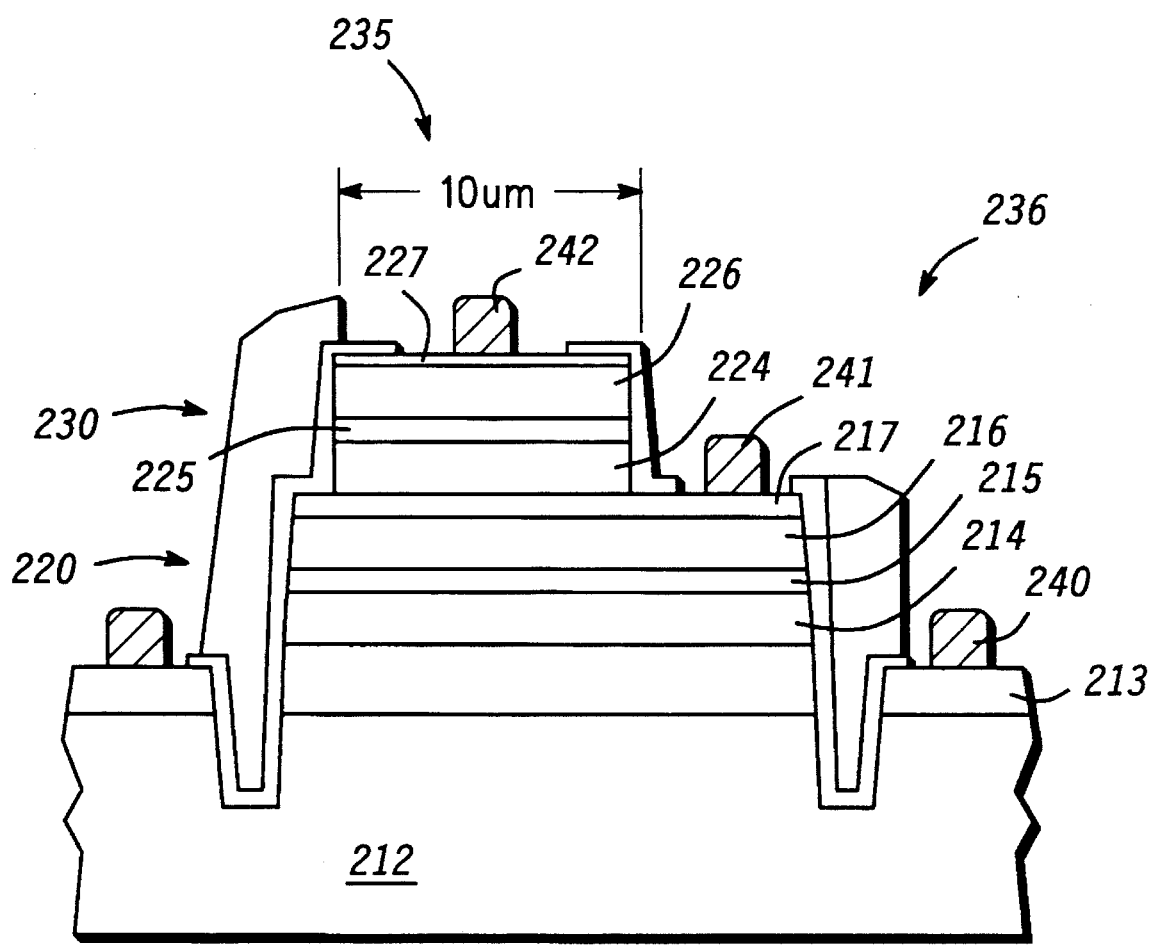
FIG. 8  _210_

FULL COLOR LIGHT EMITTING DIODE DISPLAY ASSEMBLY

BACKGROUND OF THE INVENTION

The present invention relates, in general, to display devices, and more particularly, to light emitting diode display devices.

In the past, light emitting diodes (LEDs) have been used to create images for visual displays in a variety of applications including communication and visual display devices. In order to provide a full color display, it is important to have LEDs that produce pure red, green, and blue colors that can be combined at different intensities to produce all the required colors of a full color display. Multicolor organic LEDs have even been fabricated on a single substrate in order to create a multicolor image or display. One example of such a multicolor organic LED array is given in U.S. Pat. No. 5,424,560 issued to Norman et al. on Jun. 13, 1995. One problem with prior multicolor organic LED displays is that either the red or green color is not of a appropriate wavelength to produce a full color display. For example, organic LEDs generally produce a red that has a peak at about 610 nanometers instead of the desired 650 nanometers for the color red. Consequently, displays utilizing such organic LEDs do not produce proper full color displays.

Additionally, it is very difficult to produce a gallium arsenide semiconductor LED that emits blue light with a peak around the 400 to 470 nanometers desired for the color blue.

Further, it is very difficult to produce on a single substrate semiconductor LEDs that emit blue light at the desired wavelength along with red and green light at the desired wavelengths.

Accordingly, it is desirable to have full color light emitting display that has red, blue, and green LEDs that have peaks in the desirable ranges in order to provide full color images.

BRIEF DESCRIPTION OF THE DRAWINGS

FIG. 7 illustrates an electrical schematic of the diode of FIG. 6 in accordance with the present invention; and FIG. 8 illustrates an enlarged cross-sectional portion of another embodiment of a multi-wavelength semiconductor light emitting diode in accordance with the present invention.

DETAILED DESCRIPTION OF THE DRAWINGS

Figure 1:
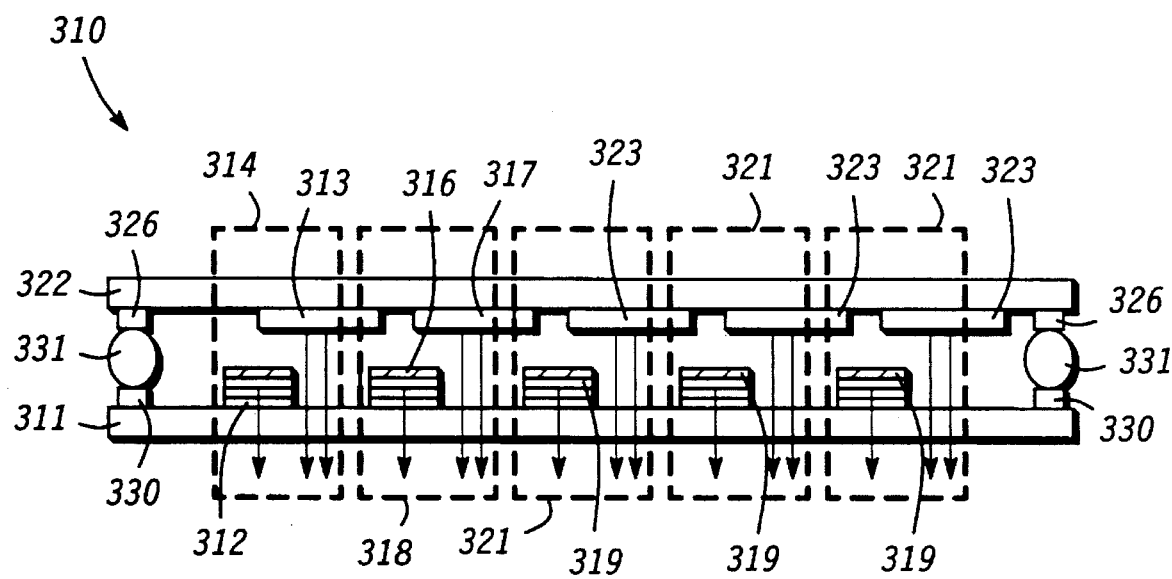
FIG. 1 illustrates an enlarged cross-sectional portion of a full color light emitting diode display assembly according to the present invention.

FIG. 1 illustrates an enlarged cross-sectional portion of a full color light emitting diode display assembly or full color light emitting diode display 310 that emits red, green, and blue light suitable for making a full color display or image. Display 310 includes an optically transparent substrate 311 that allows red, green, and blue colors to pass therethrough. Typically, substrate 311 is glass or transparent plastic. A plurality of organic light emitting diodes is formed into an organic light emitting diode array on a top surface of substrate 311 so that light emitted by the plurality of organic light emitting diodes passes through substrate 311. The plurality of organic light emitting diodes includes a first organic light emitting diode (LED) 312, a second organic light emitting diode (LED) 316, and organic light emitting diodes (LED) 319. Diodes 312, 316, and 319 emit blue light that typically has a spectrum that is centered at approximately 470 nanometers and a spectral width of approximately eighty to one hundred fifty nanometers. An example of such a light emitting diode is disclosed in U.S. Pat. No. 5,424,560 issued to Norman et al. on Jun. 13, 1995.

Diodes 312, 316, and 319 are centered to a spacing that is suitable for a pixel spacing of the desired image to be provided by display 310. Additionally, an intervening space is provided between diodes 312, 316, and 319 in order to allow transmission of light from other diodes which will be explained hereinafter. In the preferred embodiment, diodes 312, 316, and 319 are approximately ten microns wide and are arranged on twenty micron centers in order to leave an intervening space of approximately ten microns. Each of diodes 312, 316, and 319 is a multi-layer device that includes an optically transparent hole supply conductor formed on substrate 311. A first color organic layer is positioned on the hole supply layer, and a second color organic layer that is positioned on the first color organic layer. The second color organic layer has a defined area for an electron supply conductor, and a low work function conductor functioning as an electron supply conductor on the defined area. For example, the optically transparent hole supply conductor can be indium tin oxide, the first organic layer could use N,N'-diphenyl-N,N'-bis(3-methylphenyl)1-1-biphenyl-4,4'diamine, the second organic layer may be aluminum tris(8-hydroxyquinoline), and the electron supply conductor can be magnesium-silver or lithium-silver or other suitable materials known to those skilled in the art.

Display 310 also includes a semiconductor substrate 322 that has a plurality of multi-wavelength semiconductor light emitting diodes (LEDs) formed into an array on substrate 322. The plurality of multi-wavelength LEDs includes a first multi-wavelength light emitting diode 313, a second multi-wavelength light emitting diode 317, and multi-wavelength light emitting diodes 323. Diodes 313, 317, and 323 each emit both red and green light. The red light typically has a spectrum with a peak at approximately 650 nanometers with a spectral width of about twenty nanometers, and the green light typically has a spectrum with a peak at approximately 570 nanometers with a spectral width of about fifteen nanometers. Such LEDs are further described in more detail along with construction techniques hereinafter. Diodes 313, 317, and 323 are arranged to emit light through the intervening space between diodes 312, 316, and 319. Additionally, diodes 313, 317, and 323 typically are larger than the width of the intervening space so that minor misalignments between substrates 311 and 322 do not affect the accuracy or alignment for each pixel of display 310. In the preferred embodiment, diodes 313, 317, and 323 are approximately fifteen microns wide and are arranged on twenty micron centers.

Substrate 322 is attached to substrate 311 in order to align the array of semiconductor light emitting diodes with the array of organic light emitting diodes. An attachment area 330 is formed on substrate 311 and a corresponding attachment area 326 is formed on substrate 322. An attachment device 331 is utilized to attach substrate 322 to attachment areas 330. Also, device 331 typically provides electrical connection between substrates 322 and 311. Attachment device 331 can be any of a number of attachment techniques including solder bumps or conductive epoxy bumps. In the preferred embodiment, areas 326 and 330 are a plurality of mounting pads, and device 331 is a plurality of solder bumps having a diameter of approximately forty microns, thus, a plurality of bumps and a plurality of mounting pads facilitate attaching substrates 311 and 322. An example of such attachment areas is provided in U.S. Pat. No. 5,432,358 issued to Nelson et al. on Jul. 11, 1995. Consequently, the array of multi-wavelength semiconductor light emitting diodes cooperates with the array of organic light emitting diodes to form an array of pixels of display 310. Diodes 312 and 313 form a multi-wavelength pixel 314, illustrated by a dashed box, of display 310. A multi-wavelength pixel 318 is formed by the cooperation between diode 316 and 317, and in the same manner pixels 321 illustrated by dashed boxes, are formed by the cooperation between diodes 319 and 323. By utilizing semiconductor LEDs to obtain red and green light, and organic LEDs to obtain blue light, pixels 314, 318, and 321 provide accurate red, green, and blue colors that facilitate generating a full color image on display 310.

In another embodiment of display 310, diodes 312, 316, and 319 can be semiconductor diodes that emit blue light having a spectrum that is centered at approximately 470 nanometers. Typically such blue emitting semiconductor diodes are gallium nitride. In this alternate embodiment, optically transparent substrate 311 can be sapphire, silicon carbide, or gallium nitride or other optically transparent material suitable for forming diodes 312, 316, and 319 thereon. Light emitted by diodes 312, 316, and 319 pass through substrate 311. Such blue emitting semiconductor diodes are well known to those skilled in the art.

Figure 2:
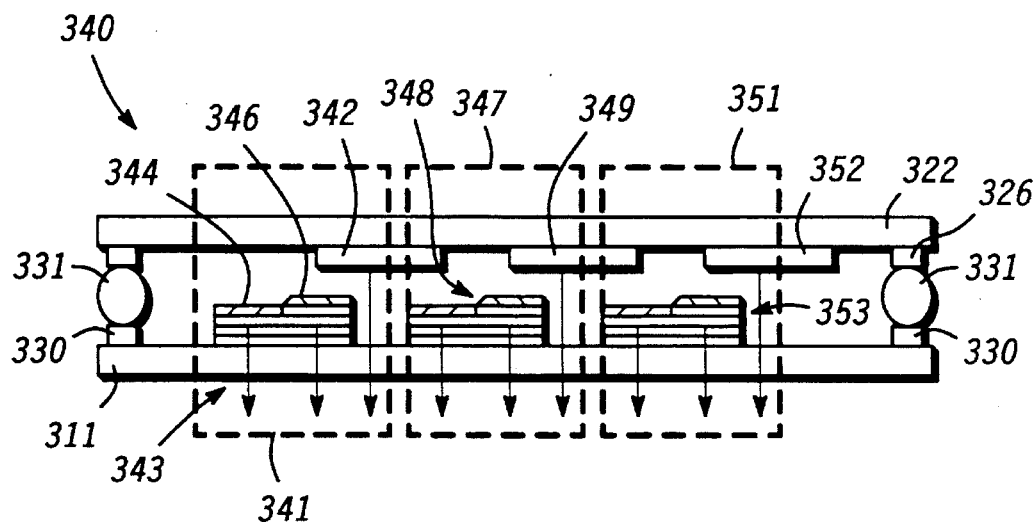
FIG. 2 illustrates an enlarged cross-sectional portion of an alternate embodiment of a full color light emitting diode display assembly according to the present invention.

FIG. 2 illustrates an enlarged cross-sectional portion of a full color light emitting diode display 340 that is another embodiment of display 310 shown in FIG. 1. Elements of FIG. 2 that have the same reference numbers as FIG. 1 are the same as the corresponding FIG. 1 elements. Display 340 also emits visible light, and includes a plurality of organic light emitting diodes formed into an organic light emitting diode array on substrate 311. The plurality of organic light emitting diodes includes a first organic light emitting diode 343, a second organic light emitting diode 348, and a third organic light emitting diode 353. Each of diodes 343, 348, and 353 contain two light emitting areas or two elements that each emit a different color of light. For example, diode 343 includes a first element 344 that emits blue light and a second light emitting element 346 that emits green light. Each of elements 344 and 346 includes an optically transparent hole supply conductor that is on substrate 311 and is common to both elements 344 and 346. A first color organic layer is positioned on the hole supply conductor, and a second color organic layer is positioned on the first color organic layer wherein the second color organic layer has a defined area for an electron supply conductor. The first and second organic layers are selected to provide blue light. The second light emitting area has a third color organic layer on a portion of the second color organic layer wherein the third color organic layer has a defined area for an electron supply conductor. The third organic layer is selected to provide green light. The first and second light emitting diodes each have a separate electron supply conductor on the area defined for the electron supply conductor so that elements 344 and 346 can be activated separately and addressed as an X-Y matrix. An example of such multi-wavelength organic LEDs is described in U.S. Pat. No. 5,424,560 issued to Norman et al. on Jun. 13, 1995.

Diodes 343, 348, and 353 are arranged on centers that are sufficient for forming multi-wavelength pixels 341, 347, and 351, respectively. Additionally, an intervening space in between diodes 343, 348, and 353 allows for transmission of light from semiconductor light emitting diodes through the intervening space and substrate 311.

Display 340 also includes a semiconductor substrate 322 having a plurality of semiconductor light emitting diodes formed into an array on substrate 322. The plurality of semiconductor light emitting diodes includes a first semiconductor diode 342, a second semiconductor diode 349, and a third semiconductor diode 352. Diodes 342, 349, and 352 are arranged on centers suitable for transmitting light through the intervening space between diodes 343, 348, and 353. Additionally, diodes 342, 349, and 352 have a width that is wider than the intervening space in order to allow for minor misalignments between substrates 322 and 311. Substrates 322 and 311 are connected by attachment areas 330 and attachment device 331 as indicated in the discussion of FIG. 1.

In the embodiment of FIG. 2, diodes 342, 349, and 352 each emit only red light in order to form multi-wavelength pixels 341, 347, and 351. As illustrated by dashed boxes, diodes 342 and 343 cooperate together to form pixel 341, diodes 348 and 349 cooperate together to form pixel 347, and diodes 352 and 353 cooperate together to form pixel 351 of display 340.

This arrangement allows display 340 to utilize organic light emitting diodes to produce both green and blue colors while using semiconductor light emitting diodes to produce red. The arrangement facilitates generating full color images by display 340.

Figure 3:
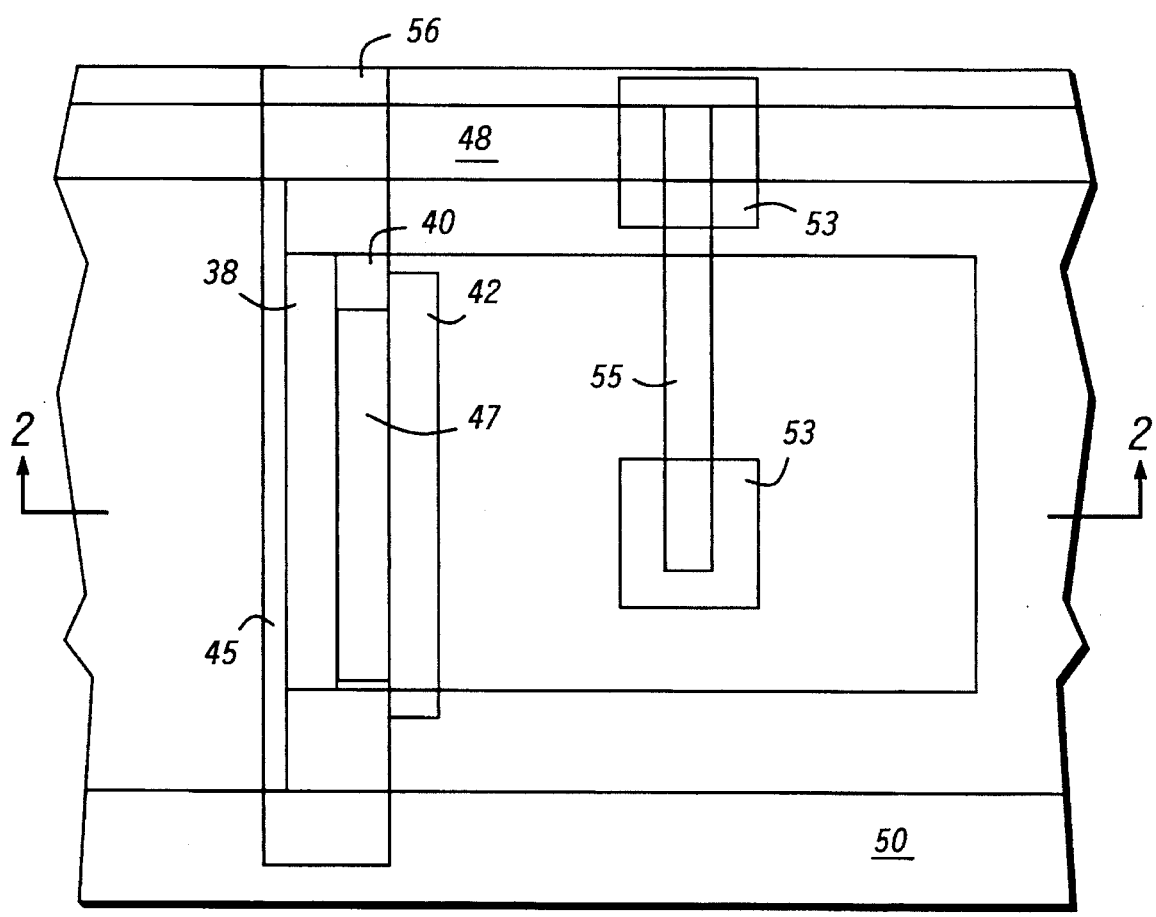
FIG. 3 illustrates an enlarged plan view of a portion of an embodiment of a multi-wavelength semiconductor light emitting diode in accordance with the present invention.
Figure 4:
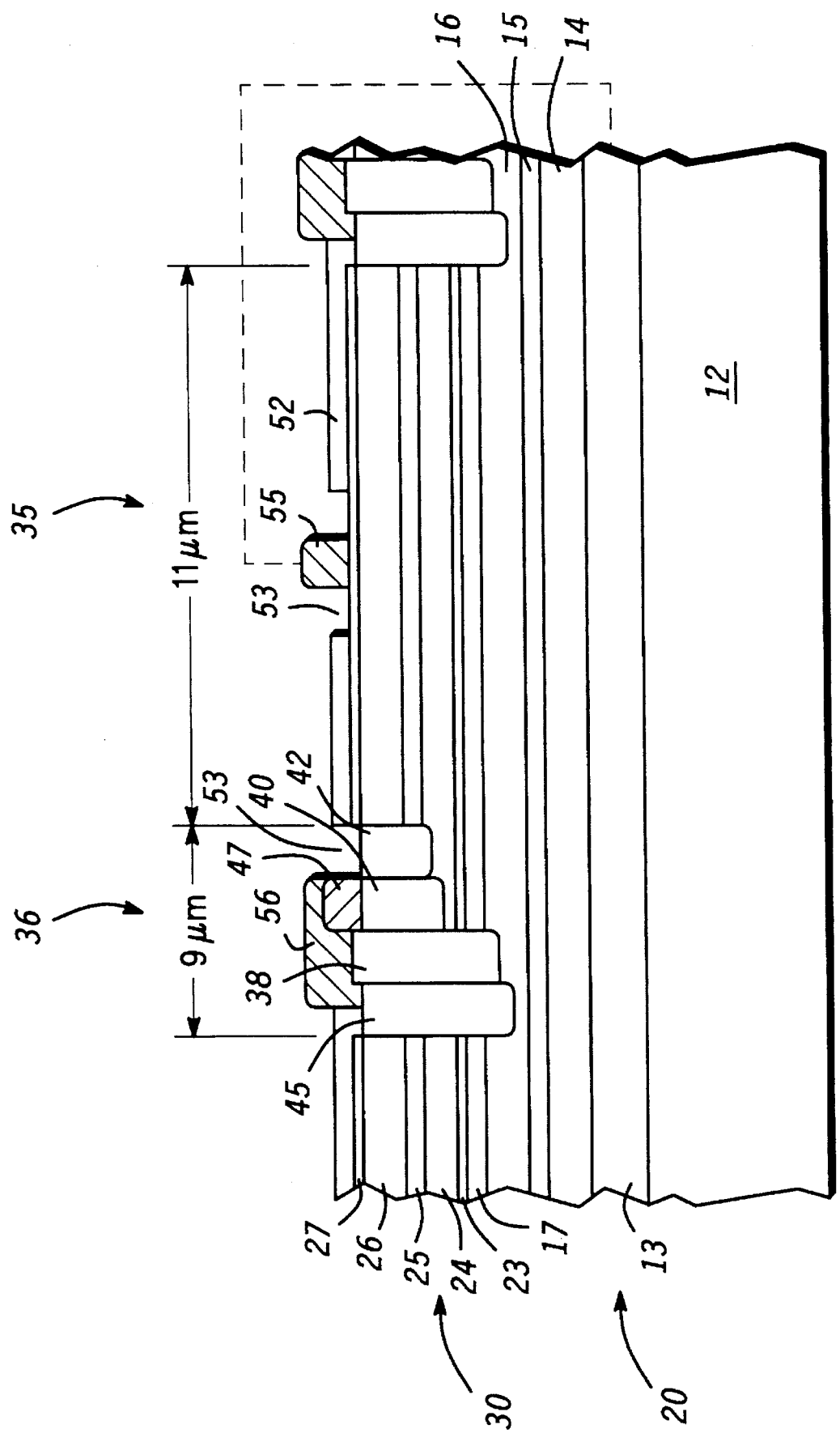
FIG. 4 illustrates an enlarged cross-sectional portion of an embodiment of a multi-wavelength semiconductor light emitting diode in accordance with the present invention.

Referring generally to FIGS. 3 and 4, a top plan and a sectional view, respectively, are illustrated of a multi-wavelength light emitting diode or device 10. Device 10 emits light of more than one wavelength similar to diode 313 discussed in FIG. 1. As can be seen best by referring to FIG. 4, device 10 includes a substrate 12 which has a generally planar upper surface. A contact layer 13 of electrically conductive material is positioned on the planar surface of substrate 12. A confinement layer 14 is positioned on the surface of contact layer 13. An active layer 15 is positioned on the surface of confinement layer 14 and another confinement layer 16 is positioned on the surface of active layer 15, thus, layer 15 is sandwiched between two confinement layers. A contact layer 17 of electrically conductive material is positioned on the surface of confinement layer 16 to complete the basic structure for a surface emitting, heterostructure light emitting diode (LED) 20.

A contact layer 23 of electrically conductive material is positioned on the surface of contact layer 17. A confinement layer 24 is positioned on the surface of contact layer 23. An active layer 25 is positioned on the surface of confinement layer 24 and another confinement layer 26 is positioned on the surface of active layer 25. A contact layer 27 of electrically conductive material is positioned on the surface of confinement layer 26 to complete the basic structure for a second surface emitting, heterostructure light emitting diode (LED) 30.

In one embodiment, the various layers are positioned as described above by epitaxially growing the layers sequentially in the order in which they are disposed. In this embodiment, as a specific example, substrate 12 is formed of semi-insulating gallium arsenide (GaAs) and the epitaxially grown layers are in the InGaAlP material system. As a further specific example: contact layer 13 is formed of heavily doped (>10$^{18}$) GaAs with n$^+$ type conductivity; confinement layer 14 is formed of InGaAlP doped for n-type conductivity; active layer 15 is formed of InGaAlP; confinement layer 16 is formed of InGaAlP doped for p-type conductivity; contact layer 17 is formed of heavily doped (>10$^{18}$) GaAs with p$^+$ type conductivity; contact layer 23 is formed of heavily doped (>10$^{18}$) GaAs with n$^+$ type conductivity; confinement layer 24 is formed of InAlP doped for n-type conductivity; active layer 25 is formed of InGaAlP; confinement layer 26 is formed of InAlP (or InGaAlP with 0% Ga) doped for p-type conductivity; and contact layer 27 is formed of heavily doped (>10$^{18}$) GaAs with p$^+$ type conductivity.

In this further specific example, heterostructure LED 30 is constructed to emit at shorter wavelengths, e.g. green light in a 570 nm range, and heterostructure LED 20 is constructed to emit at longer wavelengths, e.g. red light in a 650 nm range. Since LED 30 is constructed to emit shorter wavelength light, active layer 25 and confinement layers 24 and 26 are substantially transparent to light emitted by LED 20. Further, by forming contact layers 17 and 23 of relatively thin, heavily doped material, they are also transparent to light emitted by LED 30. Thus, multi-wavelength device 10 is constructed with a single aperture or light emitting area 35 and light from LED 30 and from LED 20 is emitted through light emitting area 35.

A specific method of fabricating an array of multi-wavelength devices 10 includes the following steps. First, a substrate with a planar surface is provided. Then a plurality of layers of material are sequentially, epitaxially formed, including layers 13–17 and layers 23–27. As a typical example, confinement layers 24 and 26 are formed of InAlP and active layer 25 is formed of InGaAlP with a 50% Al mole fraction for green light emission. It should be understood by those skilled in the art that when referring to a percentage, for example aluminum or gallium, in the present disclosure, the percentage is being expressed in terms of the amount of aluminum relative to the gallium. For example, 50% Al mole fraction would be designated In(Ga$_{1-x}$Al$_x$)P. Also, 0% Al mole fraction is InGaP and 0% Ga mole fraction is InAlP. Confinement layers 14 and 16 are formed of InGaAlP and active layer 15 is formed of InGaAlP with a 0% Al mole fraction for red light emission. It will of course be understood that other combinations can be devised and that additional LEDs can be incorporated into a single multi-wavelength device, if desired.

Light emitting area 35 and an adjacent contact area 36 are defined by masking and etching contact layer 27, or selectively depositing contact layer 27, for each multi-wavelength device 10. It should be noted that in this specific embodiment light emitting area 35 is approximately an 11 μm square area and adjacent contact area 36 is approximately 9 μm by 11 μm (see FIG. 3). Also, rows and columns of multi-wavelength devices 10 are defined.

Once light emitting area 35 and adjacent contact area 36 for each multi-wavelength device 10 is defined, an impurity 38 is implanted generally in the shape of a vertical column through confinement layer 26, active layer 25, confinement layer 24, contact layer 23 and at least in contact with contact layer 17 in adjacent contact area 36 of each multi-wavelength device 10. In the embodiment illustrated in FIGS. 3 and 4, impurity 38 extends through contact layer 17 and partially into confinement layer 16 to ensure a good electrical contact with contact layer 17. Impurity 38 provides an external, or surface, electrical connection to contact layer 17 (the anode of LED 20) for each multi-wavelength device 10 in the array. In the embodiment being described, since contact layer 17 is the p-type contact for LED 20, impurity 38 is any material that will satisfactorily couple contact layer 17 to the surface for external contact such as, for example, ions of Be.

Another impurity 40 is implanted generally in the shape of a vertical column through confinement layer 26, active layer 25, and at least in contact with confinement layer 24 in adjacent contact area 36 of each multi-wavelength device 10. Care must be taken to ensure that impurity 40 is not implanted through contact layer 17. In the embodiment illustrated in FIGS. 3 and 4, impurity 40 stops just short of contact layer 23. Once impurity 40 is implanted, an anneal step is performed to activate implanted impurities 38 and 40. The anneal step causes the usual spreading and ensures a good electrical contact with contact layer 23, without spreading into layer 17. Impurity 40 provides an external, or surface, electrical connection to contact layer 23 (the cathode of LED 30) for each multi-wavelength device 10 in the array. In the embodiment being described, since contact layer 23 is the n-type contact for LED 30, impurity 40 is any material that will satisfactorily couple contact layer 23 to the surface for external contact such as, for example, ions of Si.

A third impurity 42 is implanted through confinement layer 26, active layer 25 and at least into confinement layer 24, but not through contact layer 23, in adjacent contact area 36 between light emitting area 35 and impurity 40 (actually partially in implant formed by impurity 40) of each multi-wavelength device 10. Impurity 42 forms an isolating resistive volume between light emitting area 35 and conductive impurities 38 and 40 for each multi-wavelength device 10. Thus, impurity 42 isolates LED 30 from the external electrical connections and removes any parasitic p-n junctions that might otherwise form between impurity 40 and the p-type layers of LED 30. In the embodiment being described, impurity 42 is any material that will satisfactorily form an isolating resistive volume for separating or isolating LED 30 from the external contacts such as, for example, ions of H or O.

A fourth impurity 45 is implanted through confinement layer 26, active layer 25, confinement layer 24, contact layers 23 and 17 and at least partially into confinement layer 16 between light emitting area 35 of the adjacent multi-wavelength device 10 and impurity 38 (actually partially in impurity 38) of each multi-wavelength device 10. Impurity 45 forms an isolating resistive volume between adjacent LEDs 20 in the array of LEDs. Thus, impurity 42 isolates LED 20 and provides pixel confinement for LED 20. In the embodiment being described, impurity 45 is any material that will satisfactorily form an isolating resistive volume for separating or isolating LED 20 such as, for example, ions of H or O.

In this embodiment, a step of etching is performed at the row ends to provide an external electrical contact to contact layer 13 (the cathode of LED 20). In this step the ends of the rows are etched to expose a portion of layer 13 for electrical contact therewith.

Contact 47 with impurity 40 (the cathode of LED 30) and row contacts 48 (see FIG. 3) are formed by any of the well known methods. In general, n-type metal is deposited in rows between adjacent multi-wavelength devices 10 to the ends of the rows where, in this embodiment, row contacts 48 are coupled to contact layers 13.

A fifth impurity 50 is deep implanted through all of the epitaxial layers and into substrate 12 adjacent light emitting area 35 to provide row isolation for all multi-wavelength devices 10 positioned in rows. Impurity 50 forms an isolating resistive volume between adjacent rows of multi-wavelength devices 10. In the embodiment being described, impurity 50 is any material that can be deep implanted and will satisfactorily form an isolating resistive volume such as, for example, ions of H, or high energy O+, or equivalents.

A dielectric layer 52 is then formed or deposited over the upper surface of the entire structure and vias 53 are etched therethrough for p-type contacts and access to the n-type metal. Finally, p-type metallization is deposited using any well known method. The p-type metallization is used to form both p-type contacts 55 to contact layer 27 in light emitting area 35 of each multi-wavelength device 10 and column contacts 56. In this specific embodiment, column contacts 56 are in contact with n-type contact 47 and implanted impurity 38 for each multi-wavelength device 10 in each column. Thus, the cathode of LED 30 is connected to the anode of LED 20 by column contact 56. Further, one of vias 53 allows contact 55 to electrically couple to row contacts 48 (see FIG. 3) so that the anode of LED 30 is coupled to the cathode of LED 20.

Figure 5:
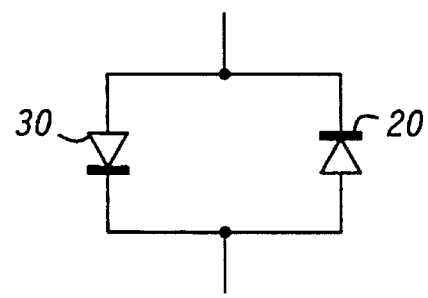
FIG. 5 illustrates an electrical schematic of the diode of FIG. 4 in accordance with the present invention.

The connections described produces a push-pull connection, illustrated schematically in FIG. 5. This push-pull connection of LEDs 20 and 30 of each multi-wavelength device 10 provides individual addressability for all of the LEDs while reducing the surface area required by at least one-half.

Figure 6:
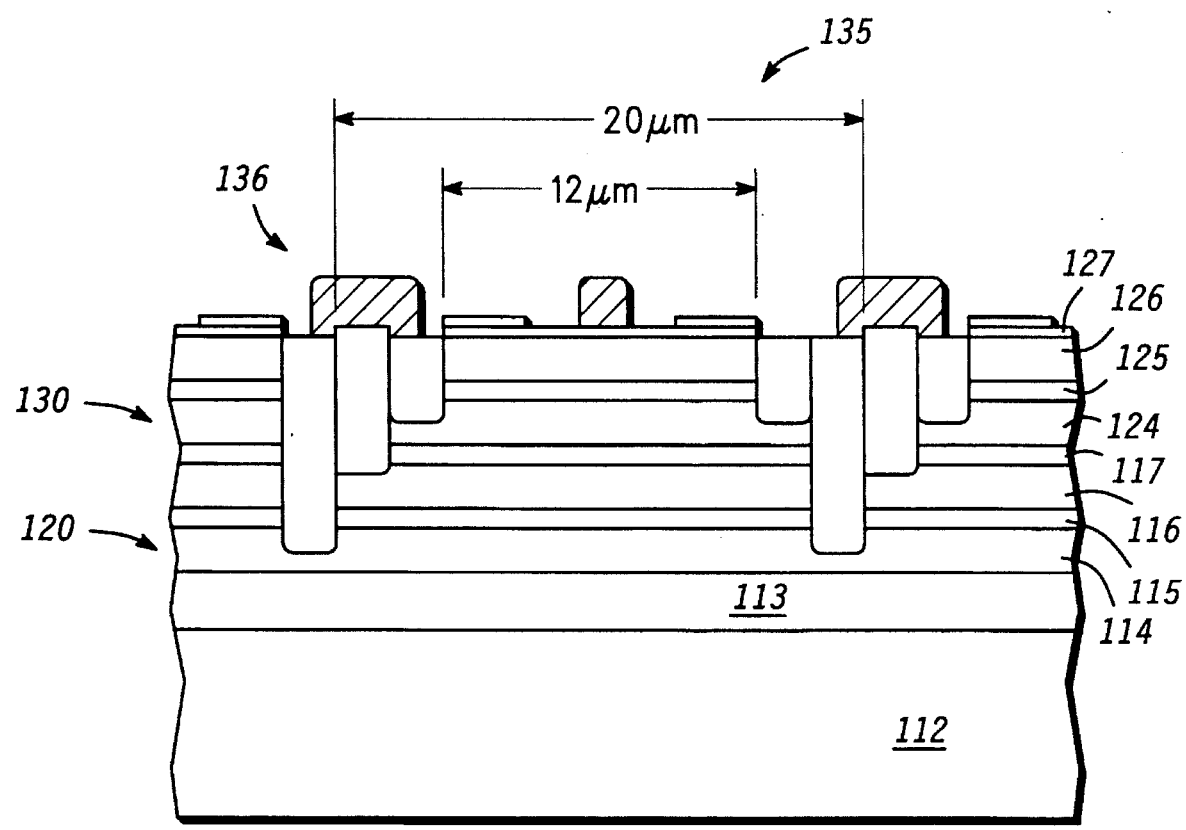
FIG. 6 illustrates an enlarged cross-sectional portion of another embodiment of a multi-wavelength semiconductor light emitting diode in accordance with the present invention.

A different embodiment including a multi-wavelength device 110 is illustrated in a sectional view in FIG. 6. It will of course be understood that device 110 can be formed on a wafer in an array of devices or as a single device. A substrate 112 is provided having a generally planar upper surface. A contact layer 113 of electrically conductive material is positioned on the planar surface of substrate 112. A confinement layer 114 is positioned on the surface of contact layer 113. An active layer 115 is positioned on the surface of confinement layer 114 and another confinement layer 116 is positioned on the surface of active layer 115. A contact layer 117 of electrically conductive material is positioned on the surface of confinement layer 116 to complete the basic structure for a surface emitting, heterostructure LED 120.

In this embodiment, contact layer 117 also serves as a contact layer for a second heterostructure LED 130 positioned on LED 120. A confinement layer 124 is positioned on the surface of contact layer 117. An active layer 125 is positioned on the surface of confinement layer 124 and another confinement layer 126 is positioned on the surface of active layer 125. A contact layer 127 of electrically conductive material is positioned on the surface of confinement layer 126 to complete the basic structure for second surface emitting, heterostructure LED 130.

In this embodiment, as a specific example, substrate 112 is formed of semi-insulating gallium arsenide (GaAs) and the epitaxially grown layers are in the InGaAlP material system. For this specific example: contact layer 113 is formed of heavily doped ($>10^{18}$) GaAs with n$^+$ type conductivity; confinement layer 114 is formed of InGaAlP doped for n-type conductivity; active layer 115 is formed of InGaAlP; confinement layer 116 is formed of InGaAlP doped for p-type conductivity; contact layer 117 is formed of heavily doped ($>10^{18}$) GaAs with p$^+$ type conductivity; confinement layer 124 is formed of InAlP doped for p-type conductivity; active layer 125 is formed of InGaAlP; confinement layer 126 is formed of InAlP doped for n-type conductivity; and contact layer 127 is formed of heavily doped ($>10^{18}$) GaAs with n$^+$ type conductivity.

As in the previous method, a light emitting area 135 and an adjacent contact area 136 are defined by masking and etching contact layer 127, or selectively depositing contact layer 127, for each multi-wavelength device 110. It should be noted that in this specific embodiment light emitting area 135 is approximately a 12 μm square area and by including adjacent contact area 136 the total square area is approximately 20 μm (see FIG. 6). Also, rows and columns of multi-wavelength devices 110 are defined.

Once light emitting area 135 and adjacent contact area 136 for each multi-wavelength device 110 are defined, an impurity 138 is implanted generally in the shape of a vertical column through confinement layer 126, active layer 125, confinement layer 124, and at least in contact with contact layer 117 in adjacent contact area 136 of each multi-wavelength device 110. Impurity 138 provides an external electrical contact for the common anodes (contact layer 117) of LEDs 120 and 130. In the embodiment being described, since contact layer 117 is the p-type contact for both LED 120 and LED 130, implanted impurity 138 can be any material that will satisfactorily couple contact layer 117 to the surface for external contact such as, for example, ions of Be.

The remaining steps of the procedure for fabricating multi-wavelength device 110 of FIG. 6 is basically the same as described in conjunction with multi-wavelength device 10 of FIG. 3. The major difference is that the step of implanting impurity 40 is not required, since the single contact layer (layer 117) is a common connection for the anodes, and as a result, multi-wavelength device 110 is a three terminal device (see schematic diagram of FIG. 7).

One advantage of this specific device and process is that one fewer process steps is required. Because multi-wavelength device 110 has a common anode and one cathode for each LED 120 and 130, these devices cannot be driven with the push-pull addressing scheme described above, but are addressed in the usual matrix manner. However, the common anode eliminates half of the I/O requirements along one direction of the array and, thereby, substantially reduces the external connections. Another possible advantage is that both LEDs 120 and 130 can be turned ON at the same time.

Referring to FIG. 8, another multi-wavelength light emitting diode device 210, embodying the present invention, is illustrated. Device 210 is constructed by positioning a plurality of layers of material on a substrate as described in conjunction with either of the previous two embodiments. The specific structure for device 210 illustrated has the same structure as described in conjunction with device 110 of FIG. 6. The steps utilized in the fabrication of device 210 are generally as described below.

A substrate 212 of semi-insulating GaAs with a planar surface is provided. A plurality of layers in the InGaAlP material system are epitaxially and sequentially grown on the surface of substrate 212. Layers 213–217 are the same as layers 113–117, described in conjunction with FIG. 6, and form a first LED 220. Layers 224–227 are the same as layers 124–127, described in conjunction with FIG. 6, and form a second LED 230.

A common light emitting area 235 and an adjacent contact area 236 are defined for each device 210 in the array. Mesa etching is performed around light emitting area 235 and adjacent contact area 236 of each multi-wavelength light emitting diode device 210 to separate each multi-wavelength light emitting diode device 210 from each adjacent multi-wavelength light emitting diode device 210. Electrical contacts 240, 241 and 242 are deposited in communication with first contact layer 213, second contact layer 217 and third contact layer 227, respectively, of each multi-wavelength light emitting diode device 210.

In multi-wavelength light emitting diode device 210 the etching defines the devices and provides isolation of LEDs and from adjacent devices. Also, the etching provides access to buried layers for external electrical connections.

Thus, embodiments of multi-wavelength semiconductor light emitting diode device structure, layout, array interconnection and fabrication processes are disclosed. The multi-wavelength semiconductor light emitting diode device disclosed is a single device which emits two or more different peak wavelengths of light from a single aperture. This substantially reduces the amount of wafer real estate that must be utilized for each device and substantially improves the pixel density and fill factor in image generators. Further, the ability to separately excite each LED (or light spectra) is extremely valuable in display applications. Separate intensity control of each LED (or spectra) in the multi-wavelength light emitting diode device allows mixing of the two spectra to provide a wide range of colors on the color chart. Also, the unique structure and fabrication process allow the plurality of LEDs to be electrically interconnected within each multi-wavelength light emitting diode device so as to implement a novel addressing scheme which minimizes the I/O required to address the array.

By now it should be appreciated that there has been provided a novel way to fabricate a full color light emitting diode display. By utilizing organic LEDs or semiconductor LEDs to provide blue light, and separate semiconductor LEDs to provide red light each pixel of the display provides sufficient colors for a full color display. Attaching the semiconductor substrate to the optically transparent substrate facilitates aligning the diodes providing red light and the diodes providing green light to cooperate in forming pixels of the display. Forming the red emitting semiconductor diodes to be larger than the space in between the blue emitting semiconductor or organic diodes allows for minor misalignments between the optically transparent substrate and the semiconductor substrate without affecting the pixels of the display. Such a full color display is suitable for producing full color images in communications and other types of applications.

We claim:

1. A full color light emitting diode display comprising:

an optically transparent substrate;

a first light emitting diode formed on the optically transparent substrate and constructed to emit light of a first wavelength, the first light emitting diode being an organic light emitting diode;

a semiconductor substrate;

a second light emitting diode constructed to emit light of a second wavelength and a third light emitting diode constructed to emit light of a third wavelength, different than the second wavelength, the second and third light emitting diodes being semiconductor light emitting diodes constructed on the semiconductor substrate and stacked together and positioned to both emit light in a same direction wherein one of the second and third light emitting diodes is transparent to light emitted by the other of the second and third light emitting diodes; and a plurality of mounting pads on the optically transparent substrate, the semiconductor substrate being attached to the plurality of mounting pads wherein the first light emitting diode cooperates with the second and third light emitting diodes to generate a pixel of the display.

2. The full color light emitting diode display of claim 1 wherein one of the second and third light emitting diodes emits light of a shorter wavelength than other of the second and third light emitting diodes.

3. The full color light emitting diode display of claim 2 wherein the light emitted by the one of the second and third light emitting diodes is green and light emitted by the other of the first and second light emitting diodes is red.

4. The full color light emitting diode display of claim 1 wherein each of the second and third light emitting diodes includes an active layer of material sandwiched between two confinement layers of material.

5. The full color light emitting diode display of claim 1 wherein the optically transparent substrate is one of glass, transparent plastic, gallium nitride, sapphire.

6. The full color light emitting diode display of claim 1 wherein the plurality of mounting pads attaches the semiconductor substrate to the optically transparent substrate, the plurality of mounting pads being one of conductive epoxy bumps or solder bumps.

7. A full color light emitting diode display comprising:

an optically transparent substrate;

a first light emitting diode constructed to emit a first light of a first wavelength and to emit a second light of a second wavelength, different from the first wavelength, the first light emitting diode being an organic light emitting diode constructed on the optically transparent substrate and the first light emitting diode being further constructed to emit the first and second lights in a direction through the transparent substrate;

a semiconductor substrate;

a second light emitting diode constructed on the semiconductor substrate to emit light of a third wavelength, different than the first and second wavelengths; and an attachment area on the optically transparent substrate, the semiconductor substrate being attached to the attachment area wherein the second light emitting diode emits light in the same direction as the first light emitting diode and cooperates with the first light emitting diode to generate a pixel of the display.

8. The full color light emitting diode display of claim 7 wherein the attachment area is a plurality of mounting pads.

9. The full color light emitting diode display of claim 8 wherein the plurality of mounting pads attaches the semiconductor substrate to the optically transparent substrate, the plurality of mounting pads being one of conductive epoxy bumps or solder bumps.

10. The full color light emitting diode display of claim 7 wherein one of the first and second lights is green and the other of the first and second lights is blue.

11. The full color light emitting diode display of claim 7 wherein each of the first and second lights is emitted by first and second emitting areas respectively, the first light emitting area includes an optically transparent hole supply conductor, a first color organic layer positioned on the hole supply conductor, and a second color organic layer on the first color organic layer wherein the second color organic layer has a defined area for an electron supply conductor, the second light emitting area having a third color organic layer on a portion of the second color organic layer wherein the third color organic layer has a defined area for an electron supply conductor, and the first and second light emitting areas having an electron supply conductor on the area defined for the electron supply conductor.

12. The full color light emitting diode display of claim 7 wherein the optically transparent substrate is one of glass and transparent plastic.

13. A full color light emitting diode display comprising:
- a semiconductor substrate having a first array of light emitting diodes that are semiconductor light emitting diodes;
- an optically transparent substrate having a second array of organic light emitting diodes; and
- an attachment area on the optically transparent substrate, the semiconductor substrate being attached to the attachment area wherein the first array of light emitting diodes cooperates with the second array of light emitting diodes to form an array of pixels of the full color light emitting diode display.

14. The full color light emitting diode display of claim 13 wherein each semiconductor light emitting diode of the first array of light emitting diodes includes a multi-wavelength semiconductor light emitting diode that emits a first wavelength of light and a second wavelength of light that is different than the first wavelength of light.

15. The full color light emitting diode display of claim 14 wherein each light emitting diode of the second array of light emitting diodes emits a third wavelength of light that is different than the first and second wavelengths of light.

16. The full color light emitting diode display of claim 13 wherein each semiconductor light emitting diode of the first array of light emitting diodes emits a first wavelength of light that includes visible light.

17. The full color light emitting diode display of claim 16 wherein each light emitting diode of the second array of light emitting diodes includes two organic light emitting areas wherein a first organic light emitting area emits a second wavelength of light that is different than the first wavelength of light, and a second organic light emitting area emits a third wavelength of light that is different than the first and second wavelengths of light.

18. The full color light emitting diode display of claim 17 wherein each organic light emitting area includes an optically transparent hole supply conductor, a first color organic layer positioned on the hole supply conductor, and a second color organic layer on the first color organic layer wherein the second color organic layer has a defined area for an electron supply conductor, a second light emitting area having a third color organic layer on a portion of the second color organic layer wherein the third color organic layer has a defined area for an electron supply conductor, and the first and second light emitting areas having an electron supply conductor on the area defined for the electron supply conductor.

* * * * *